(12) United States Patent
Russell et al.

(10) Patent No.: US 9,346,606 B1
(45) Date of Patent: May 24, 2016

(54) PACKAGE FOR REVEALING AN ITEM HOUSED THEREIN

(71) Applicant: Amazon Technologies, Inc., Seattle, WA (US)

(72) Inventors: Paul Grady Russell, Campbell, CA (US); Kevin Allen Kelly, Wichita, KS (US)

(73) Assignee: Amazon Technologies, Inc., Seattle, WA (US)

( * ) Notice: Subject to any disclaimer, the term of this patent is extended or adjusted under 35 U.S.C. 154(b) by 268 days.

(21) Appl. No.: 14/022,006

(22) Filed: Sep. 9, 2013

(51) Int. Cl.
| | |
|---|---|
| *B65D 83/00* | (2006.01) |
| *H05K 5/02* | (2006.01) |
| *A45C 11/00* | (2006.01) |
| *B65D 83/20* | (2006.01) |
| *G06F 1/18* | (2006.01) |

(52) U.S. Cl.
CPC ............ *B65D 83/00* (2013.01); *A45C 2011/002* (2013.01); *A45F 2200/0525* (2013.01); *B65D 83/206* (2013.01); *G06F 1/181* (2013.01); *H05K 5/0217* (2013.01)

(58) Field of Classification Search
CPC .................. G06F 3/16; A45F 2200/05; A45F 2200/0508; A45F 2200/0516; A45F 2200/1633; A45F 2200/0525; A45C 2011/001; A45C 2011/002; A45C 2011/003; A45C 11/00; H05K 5/00; H05K 5/0091; H05K 5/0217; H05K 7/00; H05K 7/14; H05K 5/02; H05K 5/0221
USPC ............... 312/282, 307, 138.1; 206/747, 772, 206/749, 759, 766, 773, 45.23; 381/332
See application file for complete search history.

(56) References Cited

U.S. PATENT DOCUMENTS

| | | | |
|---|---|---|---|
| 7,418,392 B1* | 8/2008 | Mozer .................... | G10L 15/26 315/307 |
| 7,720,683 B1 | 5/2010 | Vermeulen et al. | |
| 7,774,204 B2 | 8/2010 | Mozer et al. | |
| 2004/0211827 A1* | 10/2004 | Gunvaldson ....... | A47G 29/1209 232/19 |
| 2008/0290767 A1* | 11/2008 | Rimback ................ | A47B 81/00 312/223.1 |
| 2012/0223885 A1 | 9/2012 | Perez | |

FOREIGN PATENT DOCUMENTS

WO    WO2011088053 A2    7/2011

OTHER PUBLICATIONS

Pinhanez, "The Everywhere Displays Projector: A Device to Create Ubiquitous Graphical Interfaces", IBM Thomas Watson Research Center, Ubicomp 2001, Sep. 30-Oct. 2, 2001, 18 pages.

\* cited by examiner

*Primary Examiner* — Davetta W Goins
*Assistant Examiner* — Oyesola C Ojo
(74) *Attorney, Agent, or Firm* — Lee & Hayes, PLLC

(57) ABSTRACT

Packages for holding physical items, with the packages being configured to move the physical item from within a housing of the package to outside the housing as the user opens the package. For instance, the package may include a housing to at least partly surround the physical item, a sled to hold the physical item and reside within the housing before the package is opened, and a drawbridge that, when manipulated by a user, moves the sled and the item coupled thereto at least partly outside of the housing. Therefore, when the user receives an item (e.g., upon purchasing the physical item), the user may open the drawbridge to cause the physical item to transition to at least partly outside the box, providing a convenient and positive "out-of-box" user experience.

18 Claims, 12 Drawing Sheets

PACKAGE FOR REVEALING AN ITEM HOUSED THEREIN

BACKGROUND

Packages for physical items typically perform limited functionality, such as housing respective physical items during transit or during the time at which the physical item resides in a brick-and-mortar store before purchase by a consumer. However, this limited capability might not fully capitalize on the opportunity to increase overall user satisfaction with the physical item by giving the user and a convenient and memorable "out-of-box" experience.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

This disclosure describes, in part, packages for holding physical items, with the packages being configured to move the physical item from within a housing of the package to outside the housing as the user opens the package. For instance, the package may include a housing to at least partly surround the physical item, a sled to hold the physical item and reside within the housing before the package is opened, and a drawbridge that, when manipulated by a user, moves the sled and the item coupled thereto at least partly outside of the housing. Therefore, when the user receives an item (e.g., upon purchasing the physical item), the user may open the drawbridge to cause the physical item to transition to at least partly outside the box, providing a convenient and positive "out-of-box" user experience.

Figure 1:
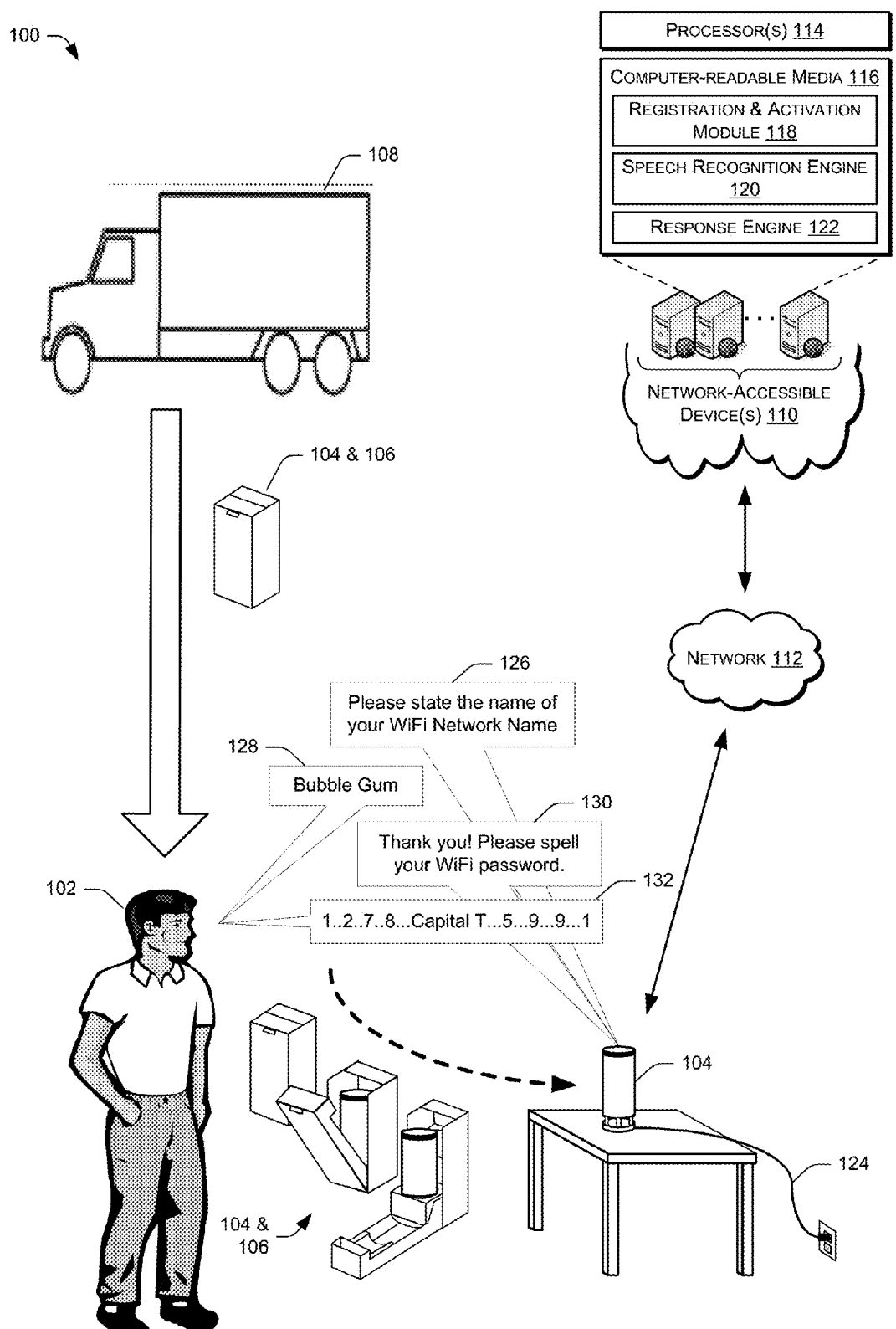
FIG. 1 shows an example out-of-box experience for a user that has acquired a voice-controlled assistant configured to receive voice commands from the user and perform actions in response.

FIG. 1 illustrates an example environment 100 in which a user 102 acquires a physical item, in this case a voice-controlled device 104, housed by a package 106. In this example, the user 102 receives the device 104 via shipment by a conveyance 108, although in other instances the user 102 may acquire the device 104 at a brick-and-mortar establishment or in any other manner. Furthermore, while FIG. 1 illustrates the package 106 housing a voice-controlled device, in other implementations the package 106 may house any other type of physical item, such as other electronic devices, spirits, jewelry, gift cards, money, furniture, and/or any other type of physical item having any size.

As illustrated, upon receiving the device 104 housed in the package 106, the user 102 may open the package 106 to access the device 104. As illustrated near the user 102, as the user opens the package 106, the package draws the device 104 from entirely within the package to at least partly outside the package. Thereafter, the user may remove the device from the package and begin configuration of the device 104. The package 106 may provide the user 102 with an improved "out-of-box" experience as compared to traditional packaging.

As introduced above, the physical item removed from the package 106 may comprise a voice-controlled device 104. In the illustrated implementation, the voice-controlled device 104 is positioned on a table within a room of the environment 100. In other implementations, it may be placed or mounted in any number of locations (e.g., ceiling, wall, in a lamp, beneath a table, under a chair, etc.). Further, more than one device 104 may be positioned in a single room, or one device may be used to accommodate user interactions from more than one room.

Generally, the voice-controlled device 104 has a microphone unit comprising at least one microphone and at least one speaker to facilitate audio interactions with the user 102 and/or other users. In some instances, the voice-controlled device 104 is implemented without a haptic input component (e.g., keyboard, keypad, touch screen, joystick, control buttons, etc.) or a display. In certain implementations, a limited set of one or more haptic input components may be employed (e.g., a dedicated button to initiate a configuration, power on/off, etc.). Nonetheless, the primary and potentially only mode of user interaction with the electronic device 104 may be through voice input and audible output. One example implementation of the voice-controlled device 104 is provided below in more detail with reference to FIG. 2.

The microphone of the voice-controlled device 104 detects audio from the environment 100, such as sounds uttered from the user 102. The voice-controlled device 104 includes a speech-recognition engine to performs speech recognition on audio signals generated based on sound captured by the microphone, such as utterances spoken by the user 102. The voice-controlled device 104 may perform certain actions in response to recognizing different speech from the user 102. The user may speak predefined commands (e.g., "Awake"; "Sleep"), or may use a more casual conversation style when interacting with the device 104 (e.g., "I'd like to go to a movie. Please tell me what's playing at the local cinema.").

In some instances, the voice-controlled device 104 may operate in conjunction with or may otherwise utilize computing resources 110 that are remote from the environment 100. For instance, the voice-controlled device 104 may couple to the remote computing resources 110 over a network 112. As illustrated, the remote computing resources 110 may be implemented as one or more servers and may, in some instances, form a portion of a network-accessible computing platform implemented as a computing infrastructure of processors, storage, software, data access, and so forth that is maintained and accessible via a network such as the Internet.

The remote computing resources 110 do not require end-user knowledge of the physical location and configuration of the system that delivers the services. Common expressions associated for these remote computing resources 110 include "on-demand computing", "software as a service (SaaS)", "platform computing", "network-accessible platform", "cloud services", "data centers", and so forth.

The servers may include processor(s) 114 and memory 116, which may store a registration and activation module 118, a speech-recognition engine 120, and a response engine 122. In combination, the speech-recognition engine 120 and the response engine 122 may receive audio signals from the device 104, recognize speech and, potentially, cause performance of an action in response. In some examples, the voice-controlled device 104 may upload audio data to the remote computing resources 110 for processing, given that their computational capacity that far exceeds the computational capacity of the voice-controlled device 104. Therefore, the voice-controlled device 104 may utilize the speech-recognition engine 120 for performing relatively complex analysis on audio captured from the environment 100.

Regardless of whether the speech recognition occurs locally or remotely from the environment 100, the voice-controlled device 104 may receive vocal input from the user 102 and the device 104 and/or the resources 110 may perform speech recognition to interpret a user's operational request or command. The requests may be for essentially any type of operation, such as database inquires, requesting and consuming entertainment (e.g., gaming, finding and playing music, movies or other content, etc.), personal management (e.g., calendaring, note taking, etc.), online shopping, financial transactions, and so forth. In some instances, the device 104 also interacts with a client application stored on one or more client devices of the user 102. In some instances, the user 102 may also interact with the device 104 through this "companion application". For instance, the user 102 may utilize a graphical user interface (GUI) of the companion application to make requests to the device 104 in lieu of voice commands. Additionally or alternatively, the device 104 may communicate with the companion application to surface information to the user 102, such as previous voice commands provided to the device 104 by the user (and how the device interpreted these commands), content that is supplementary to a voice command issued by the user (e.g., cover art for a song playing on the device 104 as requested by the user 102), and the like. In addition, in some instances the device 104 may send an authorization request to a companion application in response to receiving a voice command, such that the device 104 does not comply with the voice command until receiving permission in the form of a user response received via the companion application.

The voice-controlled device 104 may communicatively couple to the network 112 via wired technologies (e.g., wires, USB, fiber optic cable, etc.), wireless technologies (e.g., WiFi, RF, cellular, satellite, Bluetooth, etc.), or other connection technologies. The network 112 is representative of any type of communication network, including data and/or voice network, and may be implemented using wired infrastructure (e.g., cable, CAT5, fiber optic cable, etc.), a wireless infrastructure (e.g., WiFi, RF, cellular, microwave, satellite, Bluetooth, etc.), and/or other connection technologies.

Upon opening the package 106, the user 102 may power on the device 104 to begin registration and activation of the device. FIG. 1, for instance, illustrates that the user may connect the device 104 to an outlet via a cord 124. The device 104 may additionally or alternatively receive power from a battery that is local to the device 104. In either instance, upon powering on the device 104, the device 104 may begin its configuration process. For instance, the device 104 may first request that the user provide the user's wireless network name, as shown at 126. Upon receiving a reply at 128, the device 104 may perform speech recognition to identify the network name and to connect to the specified network. If the network is password protected, the device 104 may request, at 130, that the user 102 provide a password. At 132, the user 102 provides the password and, after identifying and entering the password, the device 104 may connect to the wireless network of the user 102 and to the computing resources 110.

Figure 2:
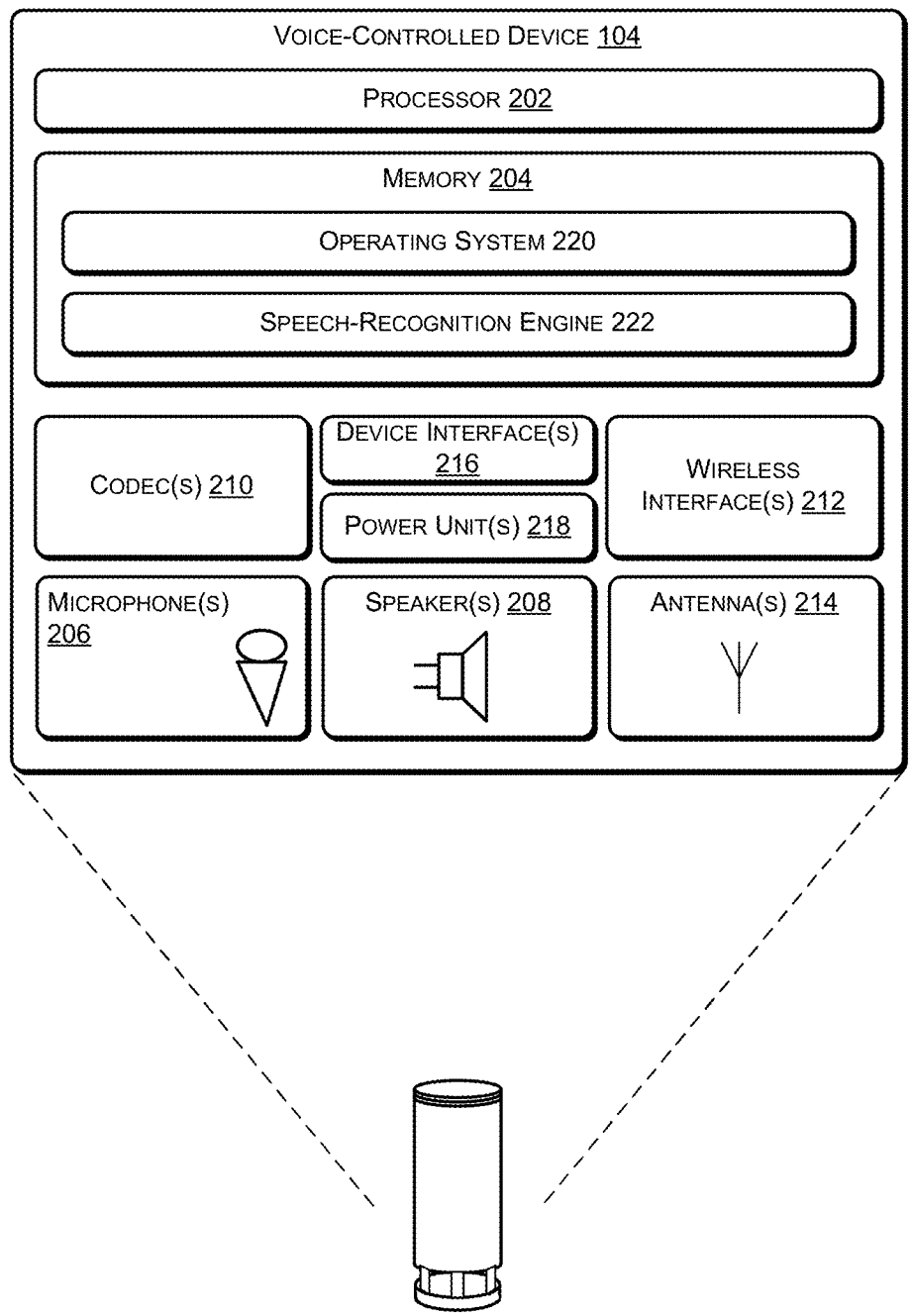
FIG. 2 shows a functional block diagram of selected components implemented at a voice controlled device of FIG. 1.

FIG. 2 shows selected functional components of one implementation of the voice-controlled device 104 in more detail. Generally, the voice-controlled device 104 may be implemented as a standalone device that is relatively simple in terms of functional capabilities with limited input/output components, memory and processing capabilities. For instance, the voice-controlled device 104 does not have a keyboard, keypad, or other form of mechanical input in some implementations, nor does it have a display or touch screen to facilitate visual presentation and user touch input. Instead, the device 104 may be implemented with the ability to receive and output audio, a network interface (wireless or wire-based), power, and limited processing/memory capabilities.

In the illustrated implementation, the voice-controlled device 104 includes one or more processors 202 and memory 204. The memory 204 may include computer-readable storage media ("CRSM"), which may be any available physical media accessible by the processor(s) 202 to execute instructions stored on the memory. In one basic implementation, CRSM may include random access memory ("RAM") and Flash memory. In other implementations, CRSM may include, but is not limited to, read-only memory ("ROM"), electrically erasable programmable read-only memory ("EEPROM"), or any other medium which can be used to store the desired information and which can be accessed by the processor(s) 202.

The voice-controlled device 104 includes a microphone unit that comprises one or more microphones 206 to receive audio input, such as user voice input. The device 104 also includes a speaker unit that includes one or more speakers 208 to output audio sounds. One or more codecs 210 are coupled to the microphone(s) 206 and the speaker(s) 208 to encode and/or decode the audio signals. The codec may convert audio data between analog and digital formats. A user may interact with the device 104 by speaking to it, and the microphone(s) 206 captures sound and generates an audio signal that includes the user speech. The codec(s) 210 encodes the user speech and transfers that audio data to other components. The device 104 can communicate back to the user by emitting audible statements through the speaker(s) 110. In this manner, the user interacts with the voice-controlled device simply through speech, without use of a keyboard or display common to other types of devices.

In the illustrated example, the voice-controlled device 104 includes one or more wireless interfaces 212 coupled to one or more antennas 214 to facilitate a wireless connection to a network. The wireless interface(s) 214 may implement one or more of various wireless technologies, such as wifi, Bluetooth, RF, and so on.

One or more device interfaces 216 (e.g., USB, broadband connection, etc.) may further be provided as part of the device 104 to facilitate a wired connection to a network, or a plug-in network device that communicates with other wireless networks. One or more power units 218 are further provided to distribute power to the various components on the device 104.

The voice-controlled device 104 is designed to support audio interactions with the user, in the form of receiving voice commands (e.g., words, phrase, sentences, etc.) from the user and outputting audible feedback to the user. Accordingly, in the illustrated implementation, there are no or few haptic input devices, such as navigation buttons, keypads, joysticks, keyboards, touch screens, and the like. Further there is no display for text or graphical output. In one implementation, the voice-controlled device 104 may include non-input control mechanisms, such as basic volume control button(s) for increasing/decreasing volume, as well as power and reset buttons. There may also be one or more simple light elements (e.g., LEDs around perimeter of a top portion of the device) to indicate a state such as, for example, when power is on or to indicate when a command is received. But, otherwise, the device 104 does not use or need to use any input devices or displays in some instances.

Several modules such as instruction, datastores, and so forth may be stored within the memory 204 and configured to execute on the processor(s) 202. An operating system module 220 is configured to manage hardware and services (e.g., wireless unit, Codec, etc.) within and coupled to the device 104 for the benefit of other modules. In addition, the memory 114 may include a speech-recognition engine 222 as discussed above with reference to FIG. 1.

Figure 3:
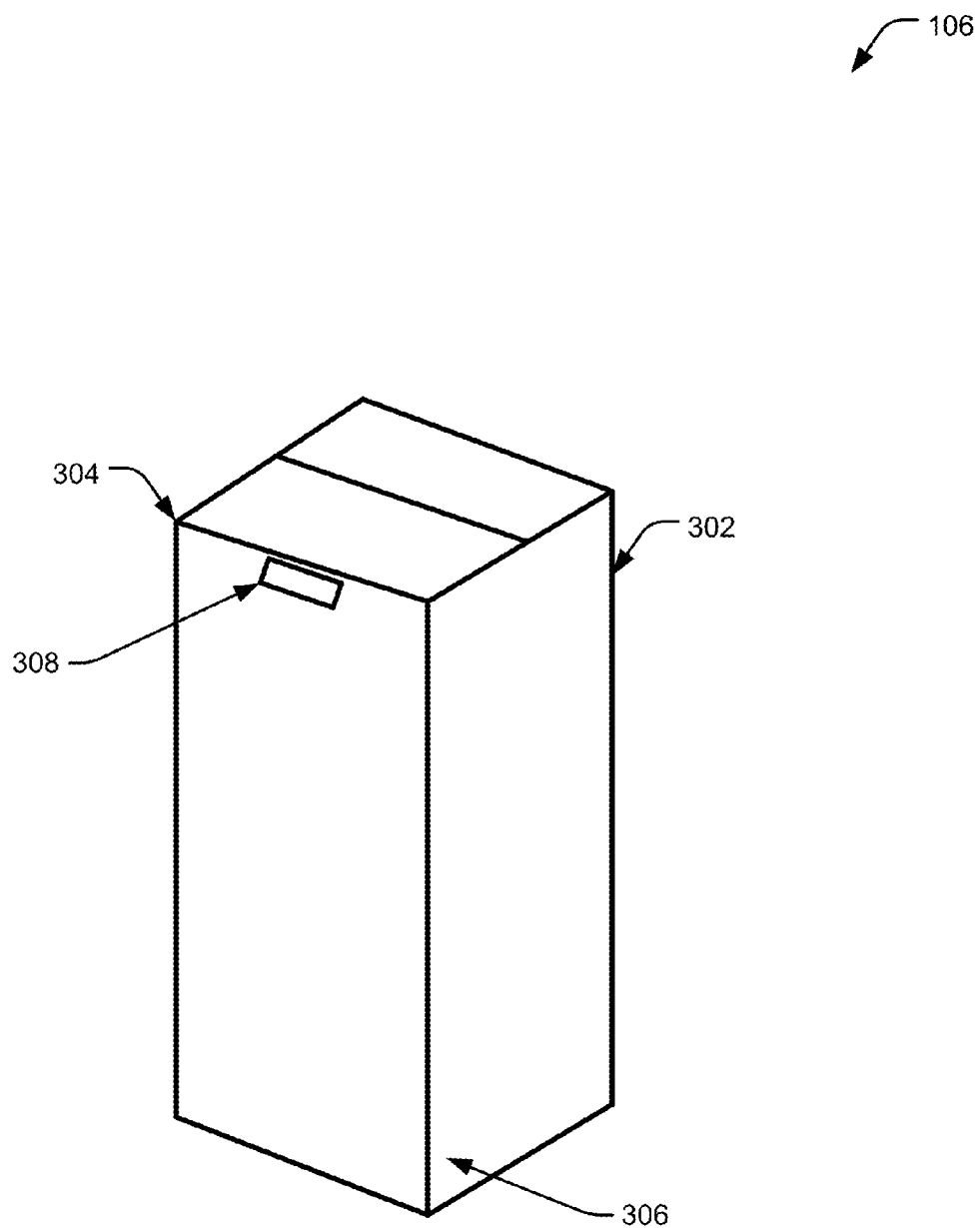
FIG. 3 shows a package configured to hold the voice-controlled device, the package being in a closed position in which the package entirely surrounds the device.

FIG. 3 shows the package 106 of FIG. 1 in a closed position with the voice-controlled device residing therein. As illustrated, the package 106 includes a housing 302, which in this instance surrounds the device by three sides, and a drawbridge or panel 304 that defines the fourth side of the package 106. In this example, the panel 304 attaches to the housing 302 via a hinge 306 to allow a user to open the package by holding a tab 308 and pulling out and downwards. The hinge 306 here comprises a paper hinge, although in other instances the hinge 306 may comprise a mechanical hinge or any other sort.

Figure 4:
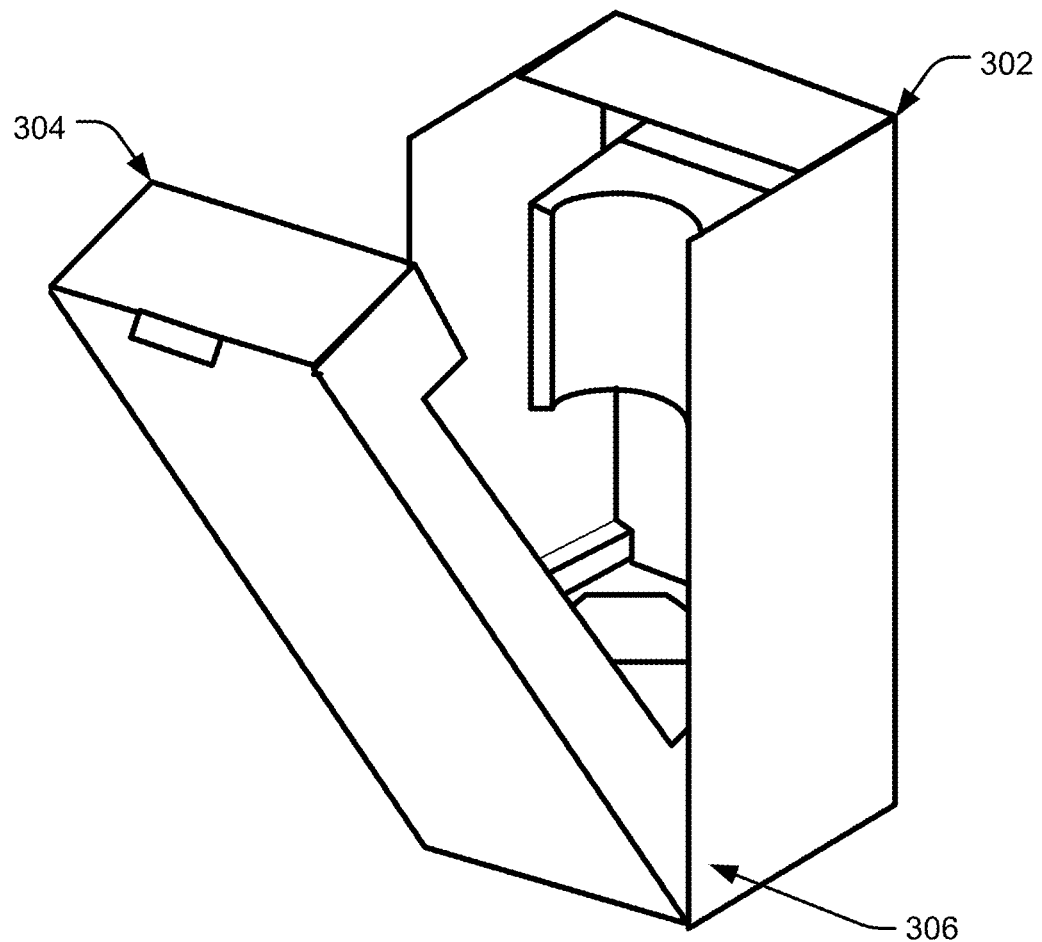
FIG. 4 shows the package of FIG. 3 as a user begins to open the package by pulling down a drawbridge or panel of the package.
Figure 5:
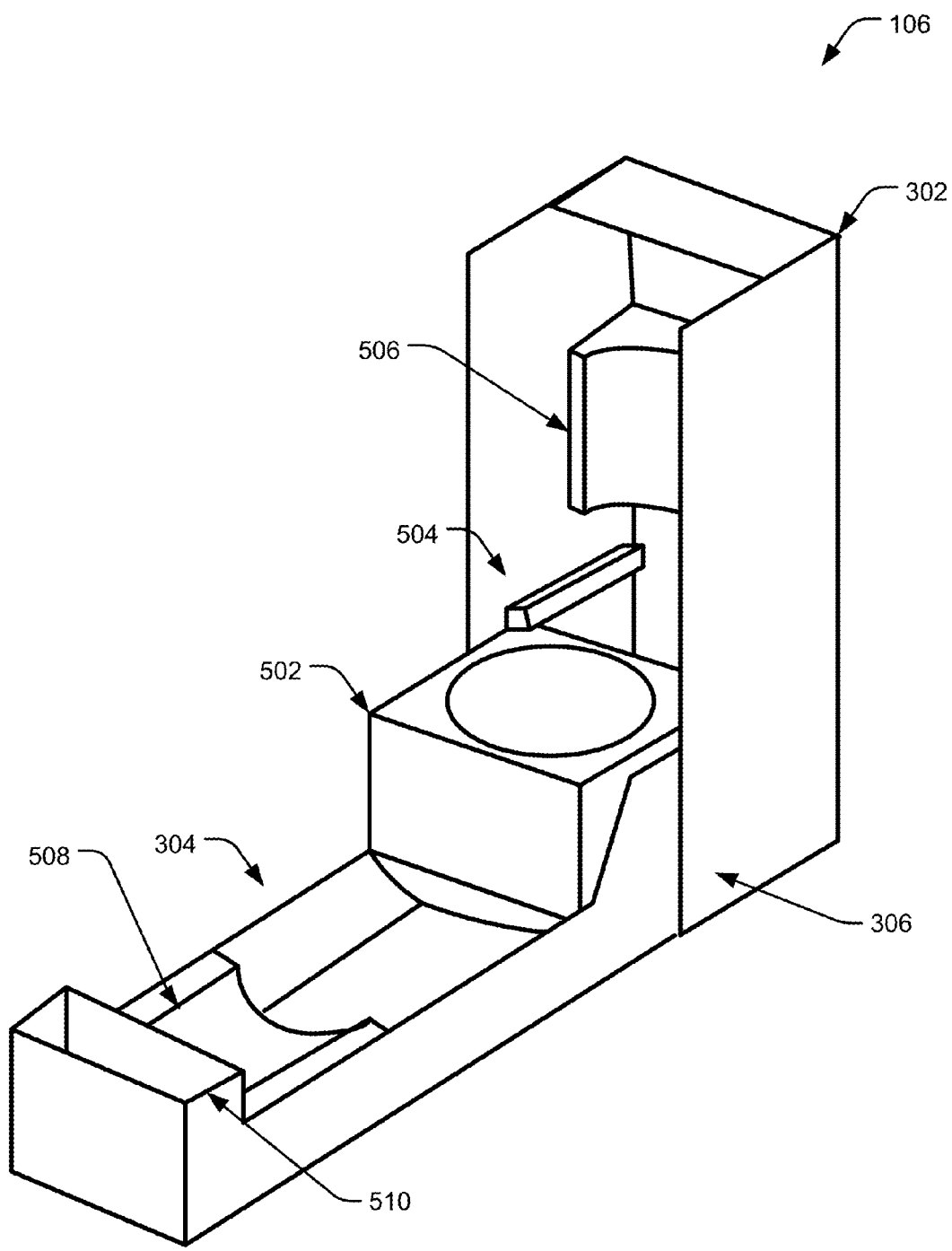
FIG. 5 shows the package after the user has fully transitioned the drawbridge or panel from a closed position to an open position. As illustrated, the drawbridge has pulled a sled that secures the voice-controlled device at least partly outside the housing of the package, thus revealing the device and allowing a user to easily remove the device from the package.

FIG. 4 shows the package of FIG. 3 as a user begins to open the package by pulling down the panel 304. FIG. 5, meanwhile, shows the package 106 after the user has fully transitioned the drawbridge or panel from the closed position of FIG. 3 to an open position. As illustrated, the panel 304 has pulled a sled 502, which is configured to secure a voice-controlled device, at least partly outside the housing 302 of the package. As illustrated, the packaging may comprise a rail system 504 that guides the sled from within the housing 302 to outside of the housing 302 during the panel's transition from the closed position to the open position. In some instances, the rail system 504 causes the sled to move in a linear direction. In addition, the housing 102 may include a support element 506 to support the voice-controlled device 104 when the device 104 is within the package 106, while the panel 304 may similarly include a support element 508. Finally, the panel 204 may define a receptacle or enclosure 510, which may be used to house an accessory of the device 104, such as the cord 124, an ear piece, an adapter, a light, or the like. Additionally or alternatively, the enclosure 510 may house other types of items, such as a user manual or other documentation.

Figure 6:
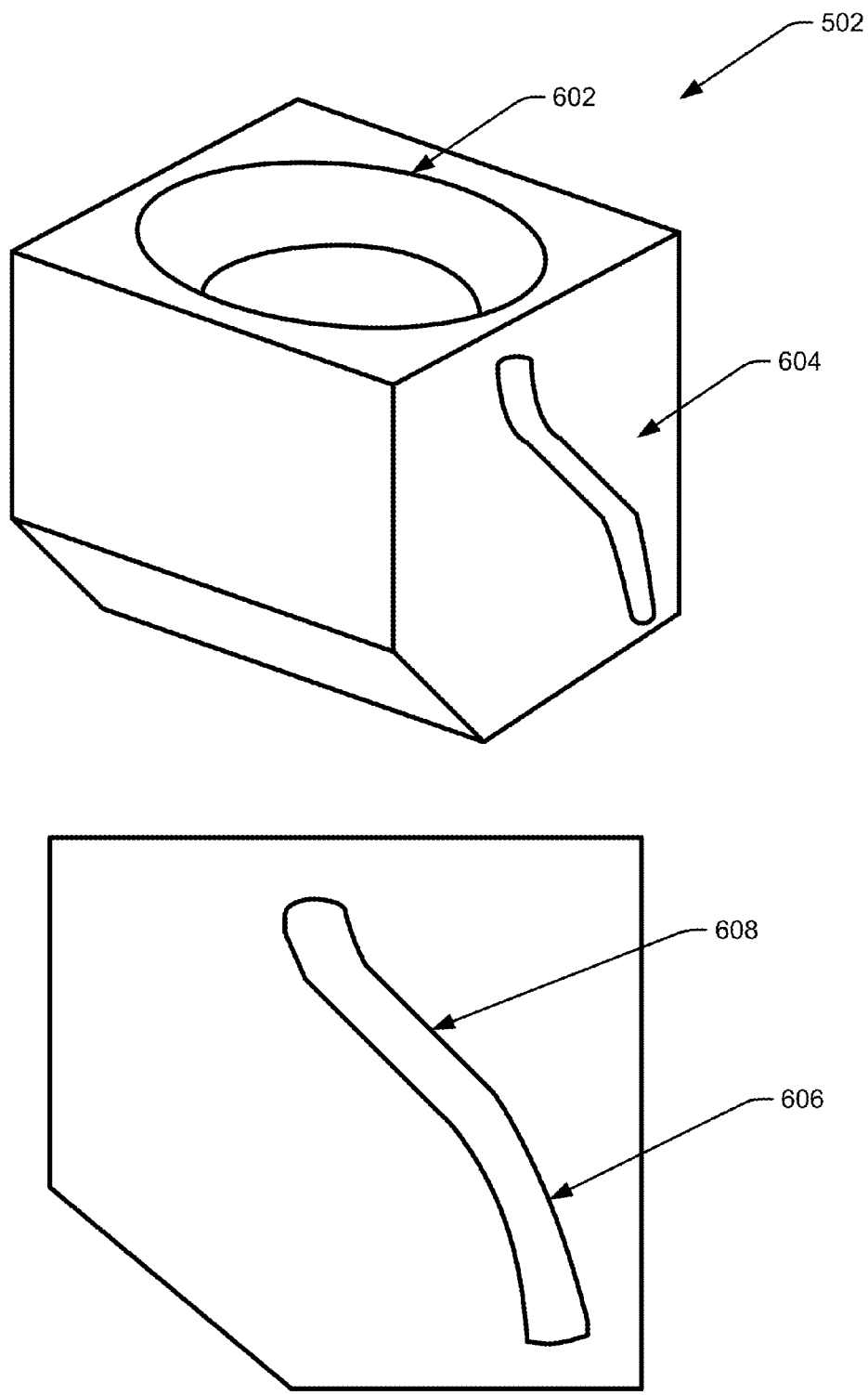
FIG. 6 illustrates an example configuration of the sled. As illustrated, the sled includes a slot configured to receive a peg of the drawbridge for pulling the sled from within the housing to outside the housing upon a user transitioning the drawbridge from the open position to the closed position.

FIG. 6 illustrates an example configuration of the sled 502. As illustrated, the sled includes a recess 602 for securing a physical item, such as the device 104. In addition, the sled 502 may include a slot 604 that is configured to receive a peg of the panel 304 for pulling the sled 502 from within the housing 302 to outside the housing 302 upon a user transitioning the panel 304 from the open position to the closed position. As further illustrated, the slot 604 may comprise first portion 606 having a radius that matches a radius defined by the hinge 306, such that the peg of the panel 302 moves freely within the first portion 606 of the slot 604 such the peg does not move the sled 502. In addition, the slot 604 includes a second portion 608 having a radius that differs from the radius of the first portion 606 such that the peg moves the sled 502 when the peg moves within the second portion 608 of the sled 502.

Figure 7A:
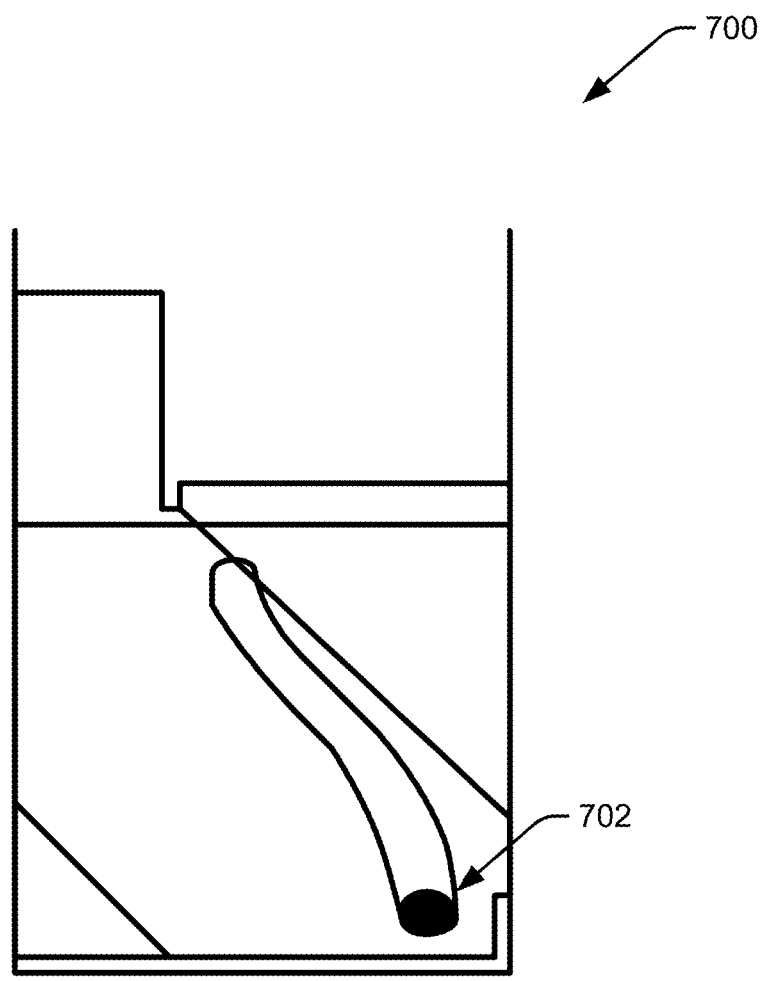
FIGS. 7A-E illustrate movement of the components of the package as a user transitions the drawbridge from the closed position to the open position.
Figure 7B:
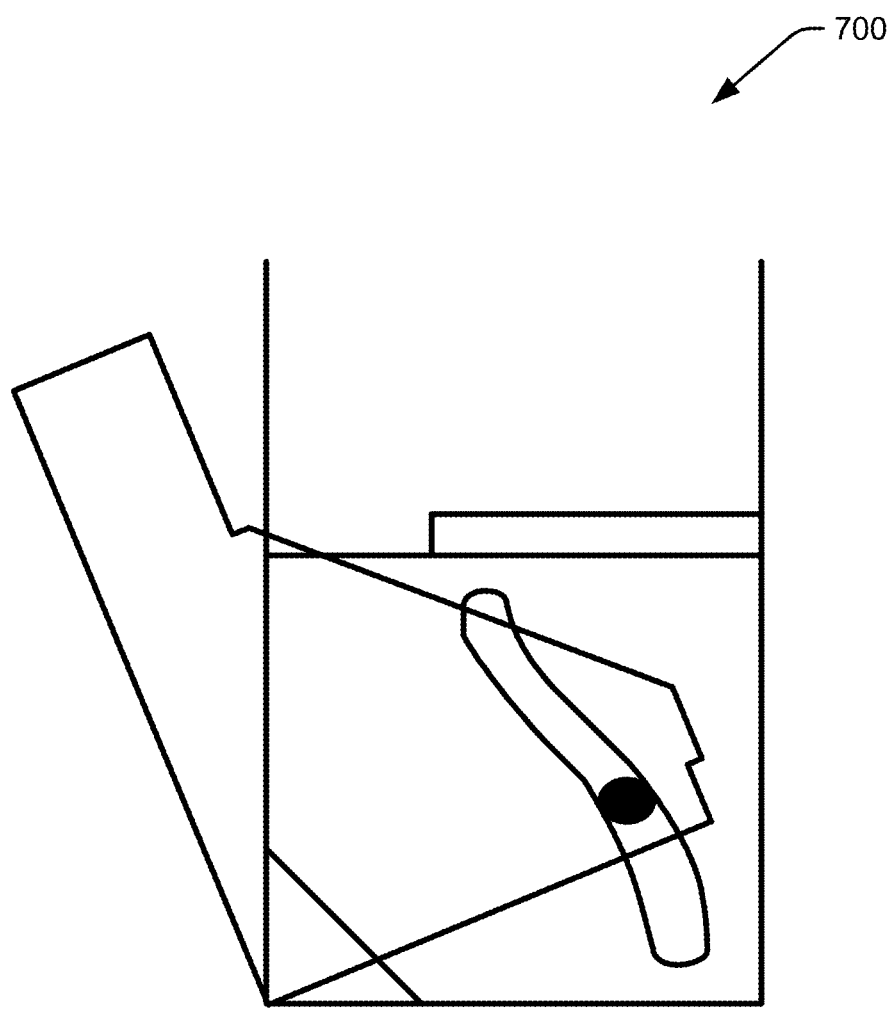

FIGS. 7A-E illustrate movement 700 of the components of the package 106 as a user transitions the drawbridge from the closed position to the open position. FIG. 7A illustrates the panel 302 in a closed position and a peg 702 residing within a bottom of the first portion 606 of the slot 604 of the sled 502. In some instances, the panel includes two pegs on each side of the panel, each directed inwardly toward the sled and within a respective slot of the sled 502, which itself may include a slot on either side. FIG. 7B illustrates the package 106 as a user begins to open to panel 302. As shown, the peg 702 moves upward within the slot 604. However, because the peg 702 slides freely within the slot when in the first portion 606, the sled does not move during this initial opening of the panel 302.

Figure 7C:
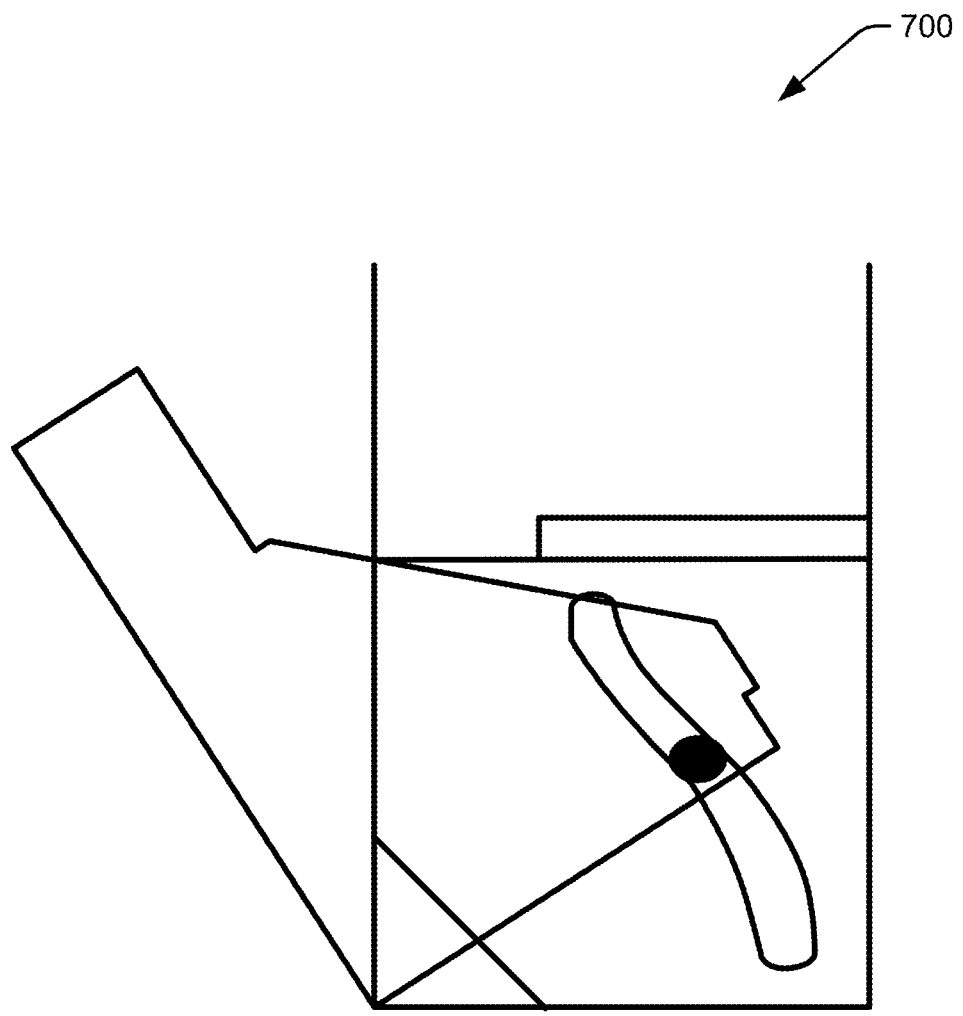
Figure 7D:
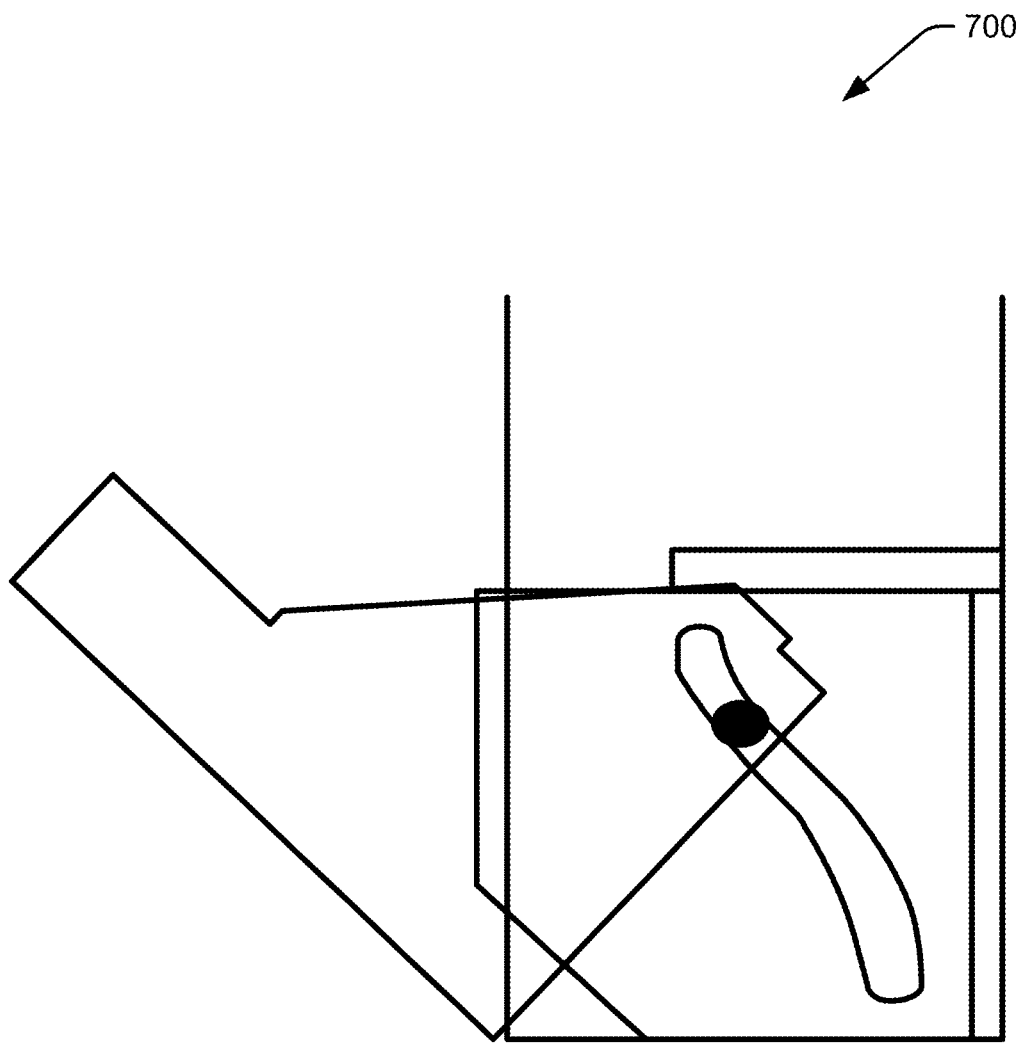
Figure 7E:
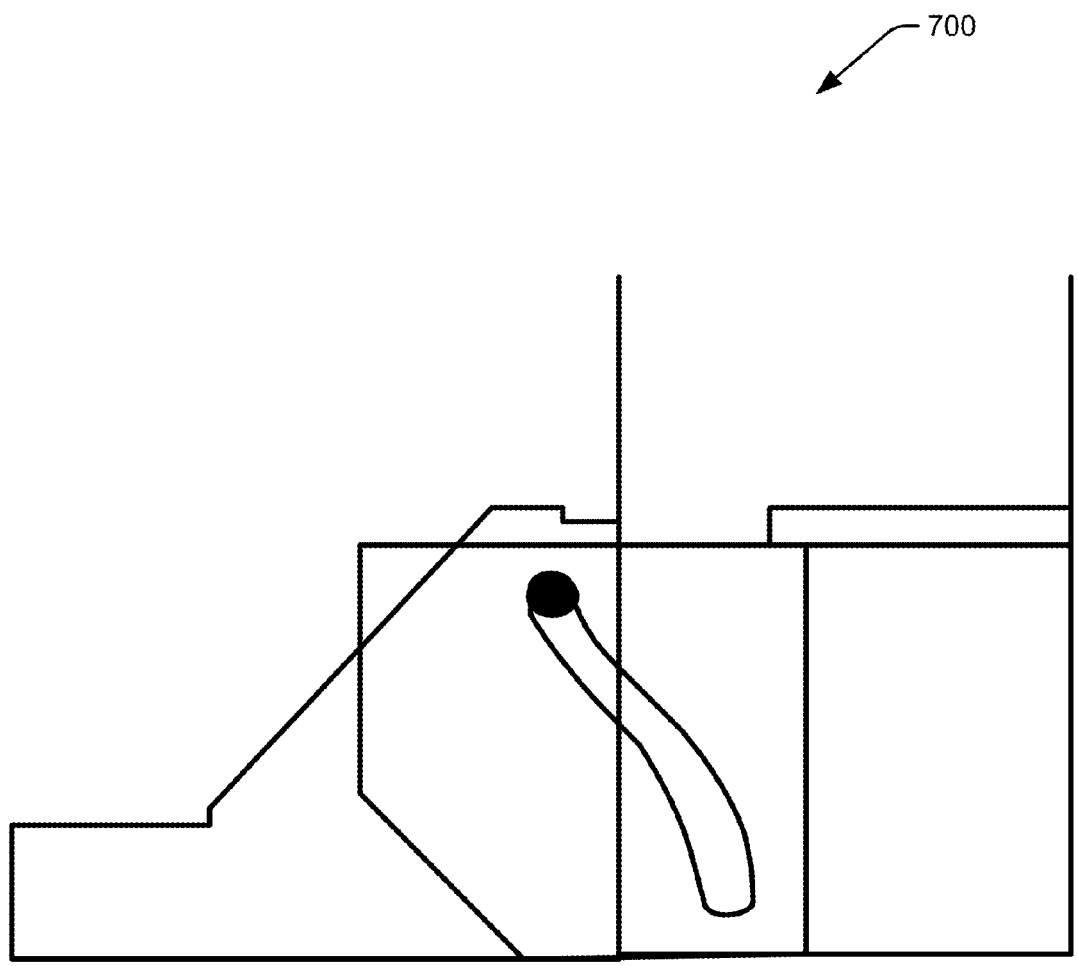

FIG. 7C illustrates the continued movement 700 of the panel 302 at a time when the peg 702 reaches a transition point between the first portion 606 of the slot 604 and a second portion 608. As shown, the sled 502 has not moved, but will upon any further movement of the panel 302. FIG. 7D illustrates the movement 700 when the peg 702 has entered the second portion 608 of the slot 604, meaning that the peg 702 of the panel has begun moving the sled 502 outside of the housing 302. Because of the rail system described above, the sled 502 moves in a linear direction as the panel 302 moves from the vertical closed position towards the substantially horizontal open position. Finally, FIG. 7D illustrates the package 302 at a time when the panel 302 is in the full open position. As shown, the peg 702 is at the top of the second portion 608 of the slot 604 and the sled 502 has moved from within the housing to partially outside the housing.

Figure 8:
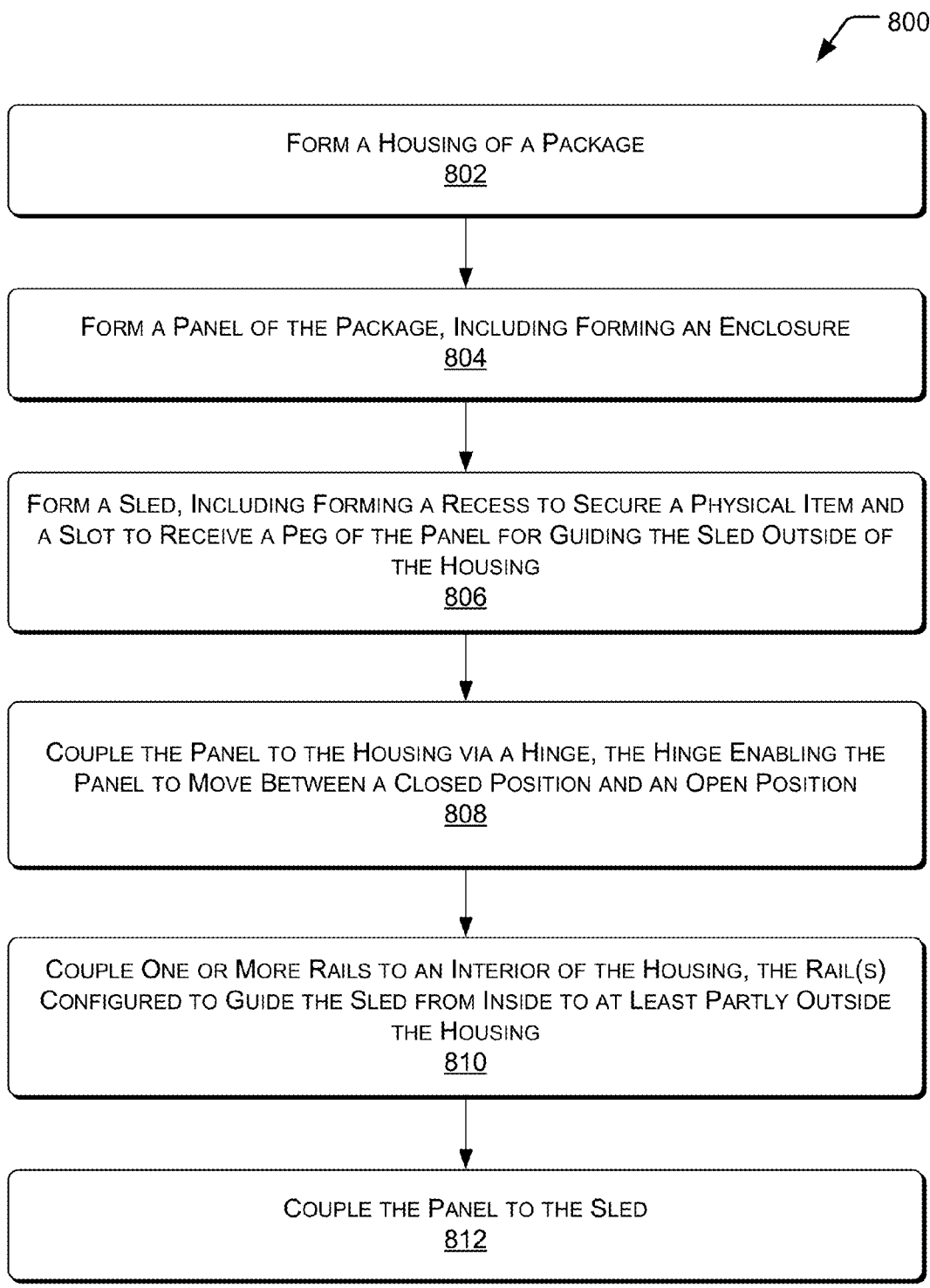
FIG. 8 illustrates a flow diagram of an example process for assembling a package described herein.

FIG. 8 illustrates a flow diagram of an example process 800 for assembling a package described herein. At 802, the process 800 represents forming a housing of a package. The housing may comprise three sides, as described in the examples herein, or may comprise any other number of sides or any other shape (e.g., half-circle, etc.). At 804, the process represents forming a panel of the package, the forming of the panel including forming an enclosure to house an accessory associated with a physical item to be housed by the package.

At 806, the process 800 represents forming a sled for securing the physical item, the forming of the sled including forming a recess to secure the physical item and forming at least one slot configured to a receive a peg of the panel. As described above, the peg may be configured to move the sled at least partly outside the housing when the panel transitions from the closed position to the open position.

At 808, the process 800 represents coupling the panel of the package to the housing of the package via a hinge, the hinge enabling the panel to transition between a closed position in which the housing and the panel enclose the physical item and an open position in which the physical item resides at least partly outside the housing. At 810, the process 800 couples one or more rails to an interior of the housing, the one or more rails configured to guide the sled to at least partly outside the housing when the panel transitions from the closed position to the open position.

Finally, at 812 the process couples the panel to a sled of the package, the sled configured to hold the physical item and the panel configured to move the sled to at least partly outside the housing when transitioning from the closed position to the open position. In some instances, the panel comprises one or more pegs directed inwardly toward a position of the sled when the sled is placed within the housing and the coupling of the panel to the sled comprises inserting the one or more pegs into the one or more slots. By assembling a package in this manner, a physical item housed within the package may be moved from within the housing to at least partly outside the panel in response to a user transitioning the panel from the closed position to the open position.

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. A system comprising:
    an electronic device configured to receive voice commands from a user and, at least partly in response, output audio to the user, the electronic device comprising:
        a microphone unit configured to receive the voice commands from the user; and
        a speaker configured to output the audio to the user; and
    a package configured to hold the electronic device, the package comprising:
        a housing;
        a sled configured to at least partially secure the electronic device; and
        a drawbridge, coupled to the housing and configured to transition from a closed position to an open position, the drawbridge moving the sled and the electronic device from within the housing to at least partially outside the housing during the transition from the closed position to the open position, the drawbridge at least partly surrounding a portion of the sled and comprising a peg extending inwardly towards the sled;
        wherein the sled further includes a slot to receive the peg such that when the drawbridge pivots from the closed position to the open position, the peg received in the slot pulls the sled from within the housing to at least partly outside the housing.

2. The system as recited in claim 1, the package further comprising a rail system to guide the sled from within the housing to at least partially outside the housing during the transition from the closed position to the open position.

3. The system as recited in claim 1, wherein:
    the housing and the drawbridge, when in the closed position, entirely surround the electronic device; and
    the drawbridge is configured to transition from the closed position to the open position by pivoting around a point proximate a bottom of the housing.

4. The system as recited in claim 3, wherein the drawbridge is substantially vertical when in the closed position and is substantially horizontal when in the open position.

5. The system as recited in claim 1, wherein the drawbridge is configured to move the sled and the electronic device along a linear path during the transition from the closed position to the open position.

6. A package configured to hold a physical item, the package comprising:
    a housing;
    a panel, pivotably coupled to the housing to transition between a closed position and an open position, the panel at least partly surround a sled and including a peg extending inwardly towards the sled; and
    the sled, comprising a slot to receive the peg of the panel and configured to at least partially secure the physical item, the sled being enclosed within the housing when the panel is in the closed position and moving from within the housing to at least partly outside the housing when the panel pivots from the closed position to the open position.

7. The package as recited in claim 6, wherein the package is configured to entirely surround the physical item when the panel is in the closed position.

8. The package as recited in claim 6, wherein the sled is configured to move linearly from within the housing to at least partly outside the housing when the panel pivots from the closed position to the open position.

9. The package as recited in claim 6, wherein the slot comprises a first portion having a first radius and a second portion having a second, different radius such that the sled does not move when the peg moves within the first portion of the slot and moves from within the housing to at least partly outside the housing when the peg moves within the second portion of the slot.

10. The package as recited in claim 6, wherein the panel defines an enclosure to receive one or more accessories for the physical item.

11. The package as recited in claim 6, further comprising one or more rails coupled to an interior of the housing to guide the sled from within the housing to at least partly outside the housing when the panel pivotably moves from the closed position to the open position.

12. The package as recited in claim 6, wherein:
    the package is configured to hold the physical item in a vertical position;
    the panel is configured to pivot from a vertical orientation, when in the closed position, to a substantially horizontal position, when the in the open position; and
    the panel is configured to move the sled substantially horizontally when the panel pivotably moves from the closed position to the open position.

13. A method of assembling a package for holding a physical item, the method comprising:
    coupling a panel of the package to a housing of the package via a hinge, the hinge enabling the panel to transition between a closed position in which the housing and the panel enclose the physical item and an open position in which the physical item resides at least partly outside the housing, the panel including a peg extending inwardly;
    coupling the panel to a sled of the package by inserting the peg into a slot of the sled, the sled configured to hold the physical item and the panel configured to move the sled to at least partly outside the housing when transitioning from the closed position to the open position based on the peg inserted into the slot moving the sled from within the housing to at least partly outside the housing.

14. The method as recited in claim 13, further comprising coupling one or more rails to an interior of the housing, the one or more rails configured to guide the sled to at least partly outside the housing when the panel transitions from the closed position to the open position.

15. The method as recited in claim 13, further comprising forming the panel, the forming of the panel including forming an enclosure to house an accessory associated with the physical item.

16. The method as recited in claim 15, wherein the physical item comprises an electronic device and the accessory comprises a cord configured to attach to the electronic device.

17. The method as recited in claim 13, further comprising forming the sled, the forming of the sled including forming a recess to secure the physical item and forming at least one slot configured to a receive a peg of the panel, the peg configured to move the sled at least partly outside the housing when the panel transitions from the closed position to the open position.

18. The method as recited in claim 17, wherein the forming of the at least one slot comprises forming the at least one slot with a profile that causes: (1) the peg to slide freely within the at least one slot such that the peg does not move the sled during a first portion of the transition of the panel from the closed position to the open position, and (2) the peg to pull the sled at least partly out of the housing during a second portion of the transition of the panel from the closed position to the open position.

\* \* \* \* \*